July 12, 1966 L. E. HAYDEN 3,260,841

TUNNEL DIODE MAJORITY LOGIC SERIAL BINARY ADDER/SUBTRACTOR

Filed Sept. 27, 1963 2 Sheets-Sheet 1

WITNESSES:
Bernard R. Gieguez
James F. Young

INVENTOR
Leland E. Hayden
BY Samuel [signature]

United States Patent Office 3,260,841
Patented July 12, 1966

3,260,841
TUNNEL DIODE MAJORITY LOGIC SERIAL BINARY ADDER/SUBTRACTOR

Leland E. Hayden, Baltimore, Md., assignor to Westinghouse Electric Corporation, East Pittsburgh, Pa., a corporation of Pennsylvania Filed Sept. 27, 1963, Ser. No. 312,126
6 Claims. (Cl. 235—172)

The present invention relates to majority logic binary adder/subtractor circuitry, and more particularly to majority logic binary adder/subtractor circuitry utilizing tunnel diode logic elements.

Adder/subtractor circuits to serially add or subtract multiple digit numbers in binary number form are important components in many computer applications. In the past, many of the adder/subtractor circuits have required a large number of logic components and have required a long time to generate the sum and carry or difference and borrow signals of the input signals desired to be added or subtracted. With the advent of tunnel diodes and their use in logic elements, many of these problems can be minimized. Moreover, if the tunnel diode logic elements having a common electrode configuration are utilized, a great number of tunnel diodes may be fabricated in monolithic form on dendritic materials; thus greatly reducing space requirements and the cost of the individual elements. Also, by setting and resetting the various logic elements in a predetermined time sequence, the speed of operation of the adder function can be increased.

It is, therefore, an object of the present invention to provide new and improved majority logic serial binary adder/subtractor circuitry.

It is a further object of the present to provide new and improved majority logic serial binary adder/subtractor circuitry utilizing tunnel diode logic components.

It is a further object of the present to provide new and improved tunnel diode majority logic serial binary adder/subtractor circuitry using a minimum number of logic components and having a relatively short operational time.

Generally, the present invention provides majority logic binary adder/subtractor circuitry in which tunnel diode logic elements are interconnected in a plurality of rows. The logic elements of the various rows are controlled in a timed sequence to permit the generation of output signals from incoming signals desired to be added or subtracted according to majority logic.

These and other objects of the present invention will become more apparent when considered in view of the following specification, and drawings, in which.

The present adder circuit utilizes three basic logic elements: a one-unit input tunnel diode logic element, a two-unit input tunnel diode logic element, and a tunnel diode-transistor inverter logic element. The explanation of the operations of the various circuit will be done using negative binary logic, that is, a binary "1" signal will be considered to be a signal of negative polarity and a binary "0" signal will be considered to be a signal of either ground or near ground potential. The tunnel diode logic elements used are fully described in copending application Serial No. 71,996, filed November 28, 1960, now Patent No. 3,209,160, by Dr. T. A. Jeeves and assigned to the same assignee as the present invention. However, for purposes of explanation, the various logic elements will be discussed briefly herein.

Figure 1:
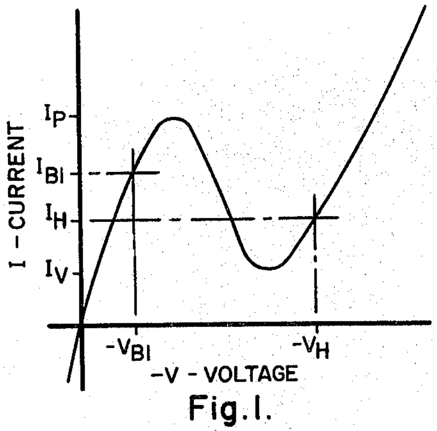
FIGURE 1 is a current versus voltage characteristic plot of a tunnel diode as utilized in the logic circuitry of FIG. 2.
Figure 2:
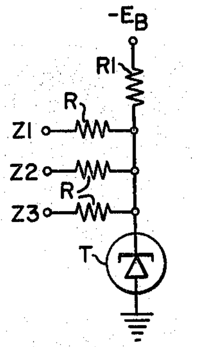
FIG. 2 is a one-unit input tunnel diode logic element.

Referring now to FIGS. 1 and 2, in FIG. 2 a tunnel diode T is shown with its anode terminal connected to ground and with its cathode terminal connected through a one-unit biasing resistor R1 to a negative source of potential $-E_B$. Connected to the junction of the cathode of the tunnel diode T and the resistor R1 are the three current limiting resistors R. Each of the current limiting input resistors R respectively have connected thereto terminals Z1, Z2 and Z3. By the proper selection of the biasing resistor R1, a voltage $-V_{B1}$ will appear across the tunnel diode T so that a current $I_{B1}$ will flow in the tunnel diode from anode to cathode. With the tunnel diode T operating at a voltage $-V_{B1}$ and a current $I_{B1}$, it will be in its positive resistance low voltage state, as can better be seen in FIG. 1 and may be termed its "0" output state. With the tunnel diode T so biased if an input signal is applied at either terminal Z1, Z2 or Z3 of sufficient magnitude to exceed the peak current $I_P$ of the tunnel diode, the tunnel diode will be driven through its negative resistive region to its next stable state, i.e., its high voltage state at the voltage $-V_H$ and at the current $I_H$. To accomplish the switching operation, the initial biasing conditions of $-V_{B1}$, $I_{B1}$ are so selected that a one-unit input signal applied at any of the terminals Z1, Z2 or Z3 will cause the tunnel diode to switch to its high voltage or "1" output state. The element of FIG. 2 is thus termed a one-unit input logic element operating in a binary manner so that if a "0" input signal is present at each of the terminals then a "0" output will appear at the other terminals. However, if a "1" signal is applied at either at any of the terminal a "1" signal will appear at each of the other two terminals.

Figure 3:
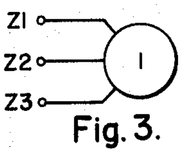
FIG. 3 is a symbolic diagram of the logic element of FIG. 2.

FIG. 3 shows the one-unit input logic element of FIG. 2 symbolically, with the numeral 1 within a circuit indicating that it requires a one-unit input signal to provide a "1" output signal from an output terminal of the device.

Figure 4:
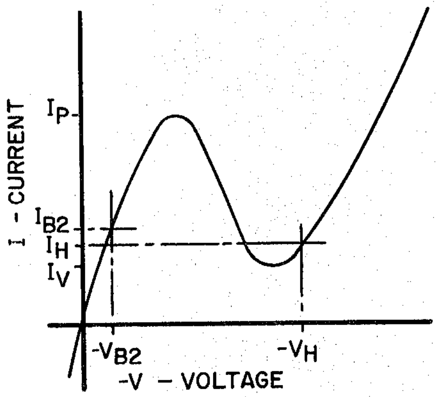
FIG. 4 is the current versus voltage characteristic plot of a tunnel diode as used in the logic circuit of FIG. 5.
Figure 5:
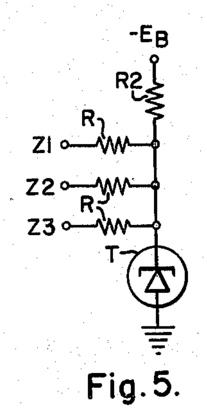
FIG. 5 is a two-unit input tunnel diode logic element.

Referring to FIGS. 4 and 5, the circuit of FIG. 5 is substantially the same as that of FIG. 2, however, the biasing resistor R2 of FIG. 5 is selected so that initially the tunnel diode T is biased along its characteristic curve only to the voltage level $-V_{B2}$ and the current level $I_{B2}$ as shown in FIG. 4. At the low voltage of "0" state as shown in FIG. 4, it would require approximately twice as much input current to exceed the peak current $I_P$ and drive the tunnel diode T of FIG. 5 into its high voltage state. Thus, in order to switch the tunnel diode T to its high voltage or "1" state at a voltage $-V_H$ and a current $I_H$ it will be necessary that a one-unit input signal be applied at two terminals of the device to receive an output signal at the other terminal of the element. With a one-signal being applied at only one of the terminals Z1, Z2 or Z3, the device would not switch to its high voltage state since current supplied from one input signal would be insufficient to exceed the peak current $I_P$. Since it requires the presence of two units of input in order to switch the device to its high voltage state, the logic element of FIG. 5 will be termed a two-unit input logic element with the device only providing a "1"

output signal when "1" input signals appear at two or more of its input terminals. This logic element may also be termed a majority logic element in that it supplies a "1" output if two out of three of its inputs are also at a "1" state.

Figure 6:
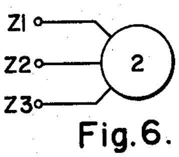
FIG. 6 is a symbolic diagram of the logic element of FIG. 5.

FIG. 6 shows a two-unit input logic element of FIG. 5 symbolically, with the numeral 2 enclosed within a circle being indicative that it requires two unit inputs in order to provide an output "1" signal.

To switch the logic elements or reset them to their initial operating conditions, a positive voltage reset or clock pulse is applied to any of the terminals. This resetting or clock pulse would be of positive polarity to drive the tunnel diodes back to their initial low voltage and current operating conditions.

Figure 7:
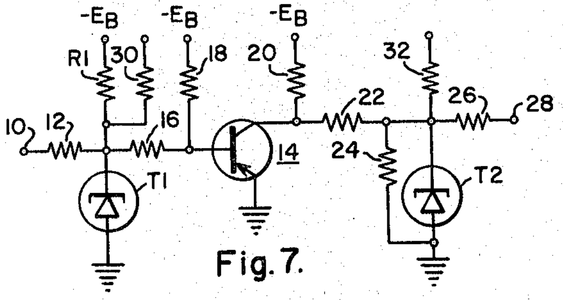
FIG. 7 is a schematic diagram of a tunnel diode-transistor inverter circuit.

FIG. 7 shows an inverter logic element including a one-unit input logic element. A tunnel diode T1 has its anode connected to ground and its cathode connected through the one-unit biasing resistor R1 to a source of biasing potential $-E_B$. An input signal is applied to a terminal 10 through the input resistor 12 to the cathode of the tunnel diode T1. A transistor 14 having its emitter grounded receives the output of the tunnel diode T1 at its base through the resistor 16 connected between the cathode of the tunnel diode T1 and the base of the transistor 14. The base and collector of the transistor 14 are respectively biased through the resistors 18 and 20 to the bias $-E_B$. A load resistor 22 is connected between the collector of the transistor 14 and the cathode of an output tunnel diode T2. The anode of the tunnel diode T2 is connected to ground. A resistor 24 is connected between the cathode and ground of the tunnel diode T2, while an output resistor 26 is connected to the cathode of the tunnel diode T2 to provide at the output terminal 28.

That the element of FIG. 7 perform the inverting logic function can be seen from the following: If an output signal is applied to the terminal 10, the tunnel diode T1 switches to its high voltage stage triggering the transistor 14 to its conducting state so that the cathode of the output tunnel diode T2 is at substantially ground potential; thus appearing like a "0" output signal at the terminal 28. If a "0" signal is applied to the input terminal 10, the input tunnel diode T1 remains in its low voltage state thereby permitting the transistor 14 to remain in its nonconductive state. Thus, the collector of the transistor 14 would be at a relatively high negative voltage, which would provide a "1" output signal at the terminal 28. The function of the output tunnel diode T2 is to clamp the output voltage to a proper level for use with subsequent tunnel diode stages.

Also, connected to the cathodes of the tunnel diodes T1 and T2 are the input resistors 30 and 32, respectively. Through these resistors are applied reset pulses which will reset the tunnel diodes T1 and T2 to their respective initial operating conditions by the application of a positive pulse thereto when it is desired to reset this particular logic element of the adder/subtractor.

Figure 8:
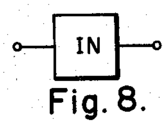
FIG. 8 is a symbolic diagram of the inverter logic element of FIG. 7.

FIG. 8 shows the inverter element of FIG. 7 symbolically with the IN within the block being indicative of the inverting logic function performed by the element.

Figure 9:
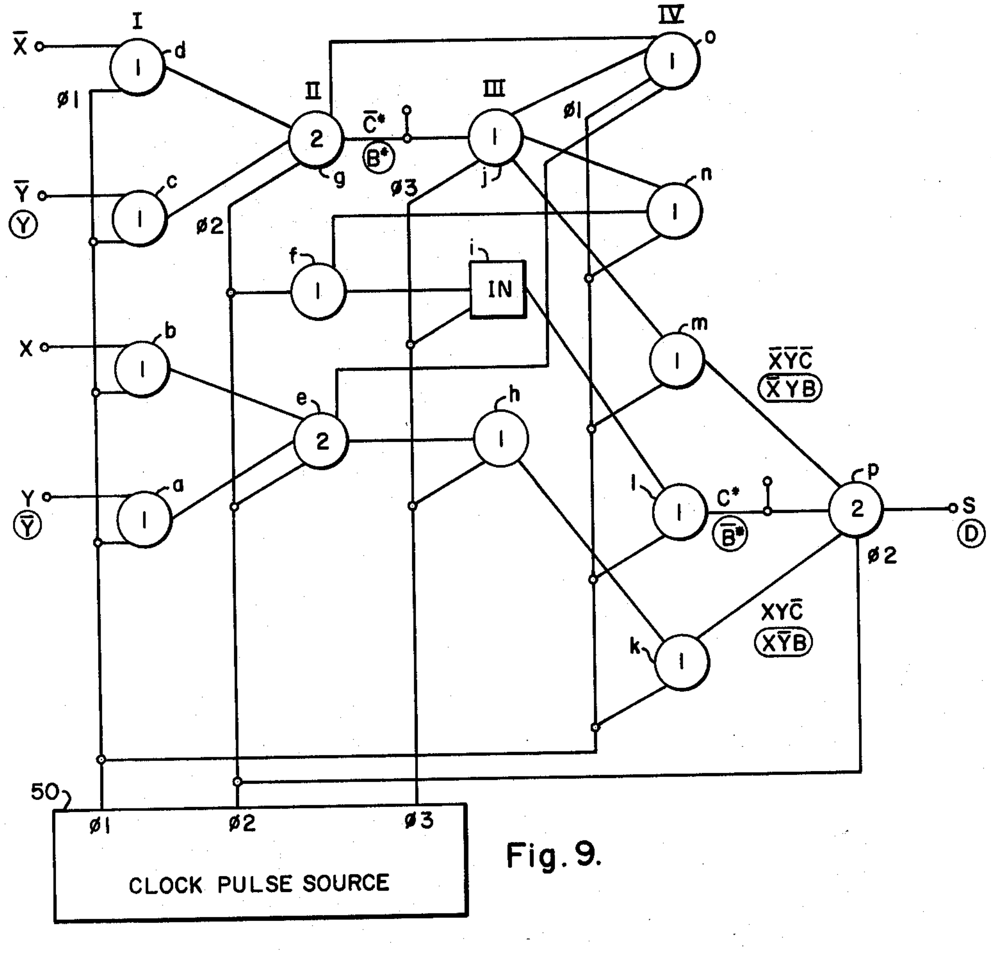
FIG. 9 is a schematic diagram of the binary adder/subtractor circuit of the present invention.

In FIG. 9 is shown the present adder/subtractor with logic elements arranged in four rows I, II, III and IV and with an output logic element. Row I includes four one-unit logic elements *a, b, c* and *d*. In the adding operation two of the elements *a* and *b* have applied thereto the input signals Y and X, respectively. The other two of the one unit logic elements *c* and *d* have applied thereto the complements of the input signals $\overline{Y}$ and $\overline{X}$, respectively. In the subtracting operation, the inputs to the logic elements *a* and *c* are interchanged, that is, the complement of the input signal $\overline{Y}$ is applied to the element *a*, while the input signal Y itself is applied to the element *c*. The inputs and logic outputs for subtraction are shown in FIG. 9, below those for addition and are encircled.

The second row II of the adder/subtractor includes: a two-unit input logic element *e*, a one-unit input logic element *f* and a two-unit input logic element *g*. The two unit logic element *e* receives as inputs the outputs from the one-unit logic elements *a* and *b*. The two-unit logic element *g* receives as inputs the outputs of the one-unit logic elements *c* and *d*.

In the row III, are included a one unit logic element *h*, an inverter logic element *i* and a one-unit logic element *j*. The one-unit logic element *h* receives as an input the output of the two-unit logic element *e* of the row II. The inverter logic element *i* receives as an input the output of the one-unit input logic element *f* of the row II. The one-unit input element *j* receives as an input signal the output of the two unit logic element *g* of the row II.

The row IV comprises five one-unit logic elements *k, l, m, n* and *o*. The one-unit logic elements *k, l* and *m* receive as inputs the outputs of the logic elements *h, i* and *j*, respectively. The logic elements *n* and *o* receive as inputs the output of the one-unit logic element *j* of the row III. The output of the one-unit logic element *n* of row IV is fed back to be the input of the one-unit logic element *f* of the row II. The outputs of the one-unit logic element *o* of row IV are fed back, respectively, as inputs to the two-unit logic elements *e* and *g* of the row II.

An output two-unit input logic element *p* is provided to receive as inputs the outputs of the one unit logic elements *k, l* and *m* of the row IV. The output of the logic element *p* is then the sum signal S in the addition process or the difference signal D in the subtraction process. The carry signal C, in addition, and the complement of the borrow signal $\overline{B}$, in subtracting, is taken from the terminal between the logic element *l* and the logic element *p*. The complementary carry signal $\overline{C}$ of the input signals X and Y may be taken from the terminal between the logic element *g* and the logic element *j*, as may be the borrow signal B in the subtraction process.

Figure 10:
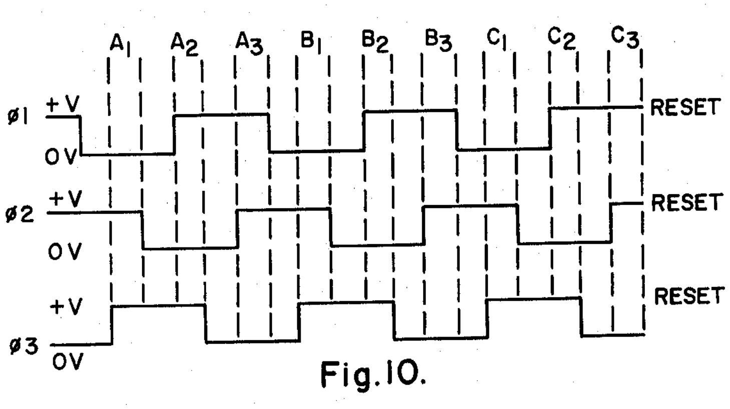
FIG. 10 is a waveform diagram as utilized to explain the operation of the adder/subtractor circuit of FIG. 9.

A clock pulse source 50 is provided to control the logic elements of the various rows and the output logic element to generate is a predescribed manner the necessary sum signals S, carry signals C or difference signals D and bottom signals B and complementary signals thereof in the addition or subtraction process. The clock pulse source 50 has three separate outputs $\phi 1$, $\phi 2$, and $\phi 3$. These outputs provided are pulses having a positive polarity which appear at the various outputs in a timed sequence, in essence, to provide a three phase output. The waveform output is shown in FIG. 10 for the three outputs $\phi 1$, $\phi 2$ and $\phi 3$. The pulses change from ground potential OV, to a positive potential +V, being the reset condition. The designations $A_1$, $A_2$, $A_3$, $B_1$, $B_2$, $B_3$, $C_1$, $C_2$, and $C_3$ represent time along the horizontal scale of the pulse waveform.

Referring now back to FIG. 9, the phase output $\phi 1$ is shown applied as inputs to each of the logic elements *a, b, c* and *d* of row I and also to each of the logic elements *k, l, m, n* and *o* of row IV. The output $\phi 2$ of the clock pulse source 50 provides inputs to each of the logic elements *e, f* and *g* of row II and also as an input to the output two-unit logic element *p*. The third output $\phi 3$ from the clock pulse source 50 is provided as inputs to the logic elements *h, i* and *j* of row III. As can better be seen from the waveform of FIG. 10, that at any given time of the outputs of the clock pulse source will be in a reset phase +V, while the other output will be at a ground OV potential to permit information to be transmitted through that particular logic element. With a reset or plus voltage being applied to a logic element, the logic element will be blocked and retained in its zero output state and will not permit any information to be transmitted therethrough since the positive voltage will maintain the tunnel diodes in their low voltage state. In time, the three outputs $\phi 1$, $\phi 2$ and $\phi 3$ sequentially move from the phase $\phi 1$ to $\phi 2$ to $\phi 3$ as can be seen, for example, during time period $A_1$, $\phi 1$ is at a zero voltage state, while $\phi 2$ and $\phi 3$ are at their reset states. At time $A_2$, the output $\phi 2$ has gone to its zero volt state, while the outputs $\phi 3$ and $\phi 1$ are at their reset states. At the time $A_3$, the output $\phi 3$ is now at a zero output volt state, while the other two phases $\phi 1$ and $\phi 2$ are at their reset state. Thus, the outputs are of such a phase relationship that the zero volt state sequentially is passed through the phases $\phi 1$, $\phi 2$ and $\phi 3$; and thus permit information to be transmitted through the adder/subtractor to perform the necessary logic functions. The subscripts 1, 2, and 3 for the times A, B and C indicate which of the phases $\phi 1$, $\phi 2$, or $\phi 3$ is at a OV state.

In order for the sum logic outputs to be provided of two input signals X and Y and a carry signal C from a preceding stage, it is necessary that the logic functions satisfy the following equation:

$$S=XY\overline{C}+\overline{X}\overline{Y}C+XYC+\overline{X}Y\overline{C}$$

This equation can be changed into majority logic terminology to be:

$$S=Maj\ (C,\ Maj\ \overline{X}\overline{Y}\overline{C},\ Maj\ XY\overline{C})$$

The carry output signal C* for the output signals X and Y may be written according to the equation:

$$C^{*}=XC+YC+XY$$

or can also be written in majority logic form:

$$C^{*}=Maj\ (XYC)$$

The complement of the carry output signal can be written in the form:

$$\overline{C}^{*}=Maj\ (\overline{X}\overline{Y}\overline{C})$$

The difference equation for the subtraction process may be written as in the majority logic form:

$$D=Maj\ (\overline{B},\ Maj\ \overline{X}YB,\ Maj\ X\overline{Y}B)$$

examples will be given to aid in understanding the operation.

Assume first in addition, for instance, that the following input conditions exist:

$$X=1,\ \overline{X}=0,\ Y=0,\ \overline{Y}=1$$

The desired output in the addition process from the logic element $p$ is $X+Y=1+0=1$. Referring to FIGS. 9 and 10, at the time $A_1$, logic elements $b$ and $c$ are set to a "1" state, while elements $a$ and $d$ are set to a "0" state. At the time $A_2$, the logic elements $e$, $f$, and $g$ are all set to a "1" state. As the next time period, $A_3$, the elements $h$ and $j$ are set to a "1" state, while the element $i$ is set to a zero state. At time $B_1$, the logic elements $k$, $m$, $n$ and $o$ are all set to a one state while the element $l$ is set to a "0" state. The answer now is obtained at the time $B_2$ from the output two-unit input logic element $p$, which is set to a "1" state which is the desired answer for the sum signal S.

The above has been a very simple example and does not show the states of all elements during each time period. The following two examples—one for addition and one for subtraction—will show in a tabular form the operating state of each of the elements during each of the time periods. The addition or subtraction of a three digit binary number will be shown.

Assume that it is desired to add the following numbers where:

$$\begin{array}{r} X=0101 \\ Y=0001 \\ \hline S=X+Y=0110 \end{array}$$

In the addition process, the input Y is applied to the element $a$ and the input $\overline{Y}$ is applied to the element $c$. Since the least significant numbers enter the adder first at time $A_1$, $X=1$ and $Y=1$.

The following table shows the step-by-step addition of $X+Y$ for the above input signals, with the state of all

TABLE A

| | Time | | | | | | | | | | | | | | | | | |
|---|---|---|---|---|---|---|---|---|---|---|---|---|---|---|---|---|---|---|
| | | $A_1$ | $A_2$ | $A_3$ | $B_1$ | $B_2$ | $B_3$ | $C_1$ | $C_2$ | $C_3$ | $D_1$ | $D_2$ | $D_3$ | $E_1$ | $E_2$ | $E_3$ | $F_1$ | $F_2$ |
| Input: Y | 1 | - | - | 0 | - | - | 0 | - | - | 0 | - | - | 0 | - | - | 0 | - | - |
| Input: X | 1 | - | - | 0 | - | - | 1 | - | - | 0 | - | - | 0 | - | - | 0 | - | - |
| Input: $\overline{Y}$ | 0 | - | - | 1 | - | - | 1 | - | - | 1 | - | - | 1 | - | - | 1 | - | - |
| Input: $\overline{X}$ | 0 | - | - | 1 | - | - | 0 | - | - | 1 | - | - | 1 | - | - | 1 | - | - |
| Element: a | - | 1 | - | - | 0 | - | - | 0 | - | - | 0 | - | - | 0 | - | - | 0 | - |
| Element: b | - | 1 | - | - | 0 | - | - | 1 | - | - | 0 | - | - | 0 | - | - | 0 | - |
| Element: c | - | 0 | - | - | 1 | - | - | 1 | - | - | 1 | - | - | 1 | - | - | 1 | - |
| Element: d | - | 0 | - | - | 1 | - | - | 0 | - | - | 1 | - | - | 1 | - | - | 1 | - |
| Element: e | - | - | 1 | - | - | 0 | - | - | 1 | - | - | 0 | - | - | 0 | - | - | 0 |
| Element: f | - | - | 1 | - | - | 0 | - | - | 1 | - | - | 1 | - | - | 1 | - | - | 1 |
| Element: g | - | - | 0 | - | - | 1 | - | - | 1 | - | - | 1 | - | - | 1 | - | - | 1 |
| Element: h | 0 | - | - | 1 | - | - | 0 | - | - | 1 | - | - | 0 | - | - | 0 | - | - |
| Element: i | 0 | - | - | 0 | - | - | 1 | - | - | 0 | - | - | 0 | - | - | 0 | - | - |
| Element: j | 1 | - | - | 0 | - | - | 1 | - | - | 1 | - | - | 1 | - | - | 1 | - | - |
| Element: k | - | 0 | - | - | 1 | - | - | 0 | - | - | 1 | - | - | 0 | - | - | 0 | - |
| Element: l | - | 0 | - | - | 0 | - | - | 1 | - | - | 0 | - | - | 0 | - | - | 0 | - |
| Element: m | - | 1 | - | - | 0 | - | - | 1 | - | - | 1 | - | - | 1 | - | - | 1 | - |
| Element: n | - | 1 | - | - | 0 | - | - | 1 | - | - | 1 | - | - | 1 | - | - | 1 | - |
| Element: o | - | 1 | - | - | 0 | - | - | 1 | - | - | 1 | - | - | 1 | - | - | 1 | - |
| Element: p | - | - | 0 | - | - | 0 | - | - | 1 | - | - | 1 | - | - | 0 | - | - | 0 |
| | | | | | | Answer ($B_2$ to $E_2$) | | | | | | | | | | | | |

elements being given. The dash (—) indicates that a particular element is off during that time period.

The answer begins to emerge at the time $B_2$ and continues until the time $E_2$ when it is completed. The answer is readout with the least significant figure first. As can be seen from the bracketed answer portion of the output of the element $p$, that an answer 0110 is obtained, which is the correct binary solution for the inputs as given above in the addition process.

The borrowing signal then written in majority logic form is:

$$B^{*}=Maj\ (\overline{X}YB)$$

Considering these equations that must be satisfied to perform the addition/subtraction processes it can be seen that the adder/subtractor of FIG. 9 will perform these functions. However, to further elaborate on the operation of FIG. 9, one simple example two more difficult To perform the subtraction logic function in the circuit of FIG. 9, it is only necessary that the inputs to the elements *a* and *c* of row I be interchanged so that $\overline{Y}$ is applied to element *c* and Y is applied to element *a*. Assuming that the three digit numbers desired to be subtracted are:

$$X=1100$$
$$\underline{Y=0101}$$
$$D=X-Y=0111$$

With the least significant figures entering the adder first at the time $A_1$, X will be equal to "0" and Y will be equal to "1." The following table shows the complete operation at each of the times and the state of each of the elements at the respective times.

TABLE B

| | | Time | | | | | | | | | | | | | | | | | |
|---|---|---|---|---|---|---|---|---|---|---|---|---|---|---|---|---|---|---|---|
| | | | $A_1$ | $A_2$ | $A_3$ | $B_1$ | $B_2$ | $B_3$ | $C_1$ | $C_2$ | $C_3$ | $D_1$ | $D_2$ | $D_3$ | $E_1$ | $E_2$ | $E_3$ | $F_1$ | $F_2$ |
| Input | $\overline{Y}$ | 0 | - | - | 1 | - | - | 0 | - | - | 1 | - | - | 1 | - | - | 1 | - | - |
| | X | 0 | - | - | 0 | - | - | 1 | - | - | 1 | - | - | 0 | - | - | 0 | - | - |
| | Y | 1 | - | - | 0 | - | - | 1 | - | - | 0 | - | - | 0 | - | - | 0 | - | - |
| | $\overline{X}$ | 1 | - | - | 1 | - | - | 0 | - | - | 0 | - | - | 1 | - | - | 1 | - | - |
| Element | *a* | - | 0 | - | - | 1 | - | - | 0 | - | - | 1 | - | - | 1 | - | - | 1 | - |
| | *b* | - | 0 | - | - | 0 | - | - | 1 | - | - | 1 | - | - | 0 | - | - | 0 | - |
| | *c* | - | 1 | - | - | 0 | - | - | 1 | - | - | 0 | - | - | 0 | - | - | 0 | - |
| | *d* | - | 1 | - | - | 1 | - | - | 0 | - | - | 0 | - | - | 1 | - | - | 1 | - |
| | *e* | - | - | 0 | - | - | 1 | - | - | 1 | - | - | 1 | - | - | 0 | - | - | 0 |
| | *f* | - | - | 0 | - | - | 1 | - | - | 1 | - | - | 1 | - | - | 0 | - | - | 0 |
| | *g* | - | - | 1 | - | - | 1 | - | - | 1 | - | - | 0 | - | - | 0 | - | - | 0 |
| | *h* | 0 | - | - | 0 | - | - | 1 | - | - | 1 | - | - | 1 | - | - | 0 | - | - |
| | *i* | 1 | - | - | 1 | - | - | 0 | - | - | 0 | - | - | 0 | - | - | 1 | - | - |
| | *j* | 0 | - | - | 1 | - | - | 1 | - | - | 1 | - | - | 0 | - | - | 0 | - | - |
| | *k* | - | 0 | - | - | 0 | - | - | 1 | - | - | 1 | - | - | 1 | - | - | 0 | - |
| | *l* | - | 1 | - | - | 1 | - | - | 0 | - | - | 0 | - | - | 0 | - | - | 1 | - |
| | *m* | - | 0 | - | - | 1 | - | - | 1 | - | - | 0 | - | - | 0 | - | - | 0 | - |
| | *n* | - | 0 | - | - | 1 | - | - | 1 | - | - | 1 | - | - | 0 | - | - | 0 | - |
| | *o* | - | 0 | - | - | 1 | - | - | 1 | - | - | 1 | - | - | 0 | - | - | 0 | - |
| | *p* | - | - | 0 | - | - | 1 | - | - | 1 | - | - | 1 | - | - | 0 | - | - | 0 |
| | | | | | | | Answer | | | | | | | | | | | | |

The answer is shown emerging from the logic element *p* at the time $B_2$ and ending at the time $E_2$. The least significant digit is readout first and thus provides the correct solution 0111 in subtracting the inputs Y from the input X.

It is, therefore, demonstrated that the adder/subtractor circuit of FIG. 9 performs the desired addition and subtraction processes with the output sum S or difference D being provided at the output of the element *p*. The carry output signal C* in the addition process and the complement of the borrow output signal $\overline{B}$* may be taken as the output of the logic element *l* of the row IV. The complementary carry output signal $\overline{C}$* in the addition process, and the borrow output signal B* in the subtraction process may be taken as the output of the element *g* of row II. The adder/subtractor circuit thus performs all of the necessary operations required of such an adder or subtractor circuit.

Although the present invention has been described with certain degree of particularity, it should be understood that the present disclosure has been made only by way of example and that numerous changes in the details of fabrication and the combination or arrangement of parts and elements may be resorted to without departing from the scope and the spirit of the present invention.

I claim as my invention:

1. A binary adder/subtractor circuit operative with input signals comprising, a first row of logic elements including four one-unit input logic elements, each receiving as an input one of said input signals; a second row of logic elements including two-unit input logic elements and one-unit input logic elements, said two-unit logic elements of said second row receiving as inputs the outputs of selected ones of said one-unit logic elements of said first row; a third row of logic elements including one-unit input logic elements and an inverter logic element, said one-unit logic elements of said third row receiving as inputs the outputs of said two-unit logic elements of said second row, said inverter logic element receiving as an input the output of said one-unit logic element of said second row; a fourth row of logic elements including one-unit input logic elements, a plurality of said one-unit logic elements of said fourth row receiving as inputs the output of one of said one-unit logic elements of said fourth row, selected ones of said plurality of one-unit input logic elements of said fourth row providing as outputs inputs to said logic elements of said second row, another of said one-unit input logic elements of said fourth row receiving as an input the output of said inverter logic element of said third row, another of said one-unit logic elements of said fourth row receiving as an input the output of one of said one-unit input logic elements of said third row; an output two-unit input logic element receiving as inputs the outputs of selected ones of said one-unit input elements of said fourth row to provide either one of a sum and difference signal of said input signals; and a clock pulse source operative to provide selectively reset pulses in a timed phase relationship as inputs to the logic elements with the reset pulses blocking information from being transmitted through a logic element to which it is applied while the absence of a reset pulse permits information to be transmitted therethrough.

2. A majority logic serial binary adder/subtractor operative with input signals comprising, a first row of logic elements including a plurality of one-unit input logic elements, each receiving as an input one of said input signals; a second row of logic elements including a plurality two-unit input logic elements and a one-unit input logic element, one of said two-unit logic elements receiving as an input the output of two of said one-unit logic elements of said first row, another of said two-unit input logic elements receiving an inputs the outputs of two other of said one-unit logic elements of said first row; a third row of logic elements including a plurality of one-unit logic elements and an inverter logic element, said plurality of one-unit logic elements of said third row receiving as inputs the outputs respectively of said plurality of two-unit logic elements of said second row, the inverter logic element receiving as an input the output of said one-unit logic element of said second row; a fourth row of logic elements including a plurality of one-unit input logic elements, three of said plurality of one-unit logic elements of said fourth row receiving as inputs the output of one of said one-unit logic elements of said fourth row, one of said three one-unit input logic elements providing as an output an input to each of said two-unit input logic elements of said second row, another of said three one-unit input elements of said fourth row providing as an output an input to said one-unit input logic element of said second row, a fourth of said one-unit input logic elements of said fourth row receiving as an input the output of said inverter logic element of said third row, a fifth of said one-unit logic elements of said fourth row receiving as an input the output of another of said one-unit input logic elements of said third row; an output two-unit input tunnel diode logic element receiving as inputs the output of selected one of said one-unit input elements of said fourth row; and a clock pulse source operative to provide reset pulses in a timed phased relationship to said logic elements in a controlled manner as inputs with the reset pulses blocking information from being transmitted through an element to which it is applied while the absence of a reset pulse permits information to be transmitted through a logic element.

3. A majority logic serial binary adder/subtractor operative with input signals comprising, a first row of logic elements including four one-unit input tunnel diode logic elements, each receiving as an input one of said input signals; a second row of logic elements including two-unit input tunnel diode logic elements and a one-unit input tunnel diode logic element, one of said two-unit logic elements receiving as an input the output of two of said one-unit logic elements of said first row, the other of said two-unit input logic elements receiving as inputs the output of the other two of said one-unit logic elements of said first row; a third row of logic elements including two one-unit input tunnel diode logic elements and an inverter logic element, said one-unit logic elements of said third row receiving as inputs the outputs respectively of said two-unit logic elements of said second row, said inverter logic element receiving as an input the output of said one-unit logic element of said second row; a fourth row of logic elements including five one-unit input tunnel diode logic elements, three of said one-unit logic elements of said fourth row receiving as inputs the output of one of said one-unit logic elements of said fourth row, one of said three-unit input logic elements providing as outputs an input to each of said two-unit input logic elements of said second row, another of said three one-unit input elements of said fourth row providing as an output an input to said one-unit input logic element of said second row, a fourth of said one-unit input logic elements of said fourth row receiving as an input the output of said inverter logic element of said third row, a fifth of said one-unit logic elements of said fourth row receiving as an input the output of the other of said one-unit input logic elements of said third row; an output two-unit input tunnel diode logic element receiving as inputs the output of the third of said three one-unit input elements of said fourth row, the outputs of said fourth and fifth logic elements of said fourth row and to provide the sum difference signal of said input signals; and a clock pulse source operative to provide reset pulses in a timed phased relationship so that reset pulses appear at separate output terminals to be applied as inputs to the various rows of logic elements and said output logic element, with the reset pulses blocking information from being transmitted through an element to which it is applied while the absence of a reset pulse permits information to be transmitted through a logic element.

4. A majority logic serial binary adder/subtractor operative with input signals comprising, a first row of logic elements including a plurality of one-unit input logic elements, each receiving as an input one of said input signals; a second row of logic elements including a plurality of two-unit input logic elements and a one-unit input logic element, one of said two-unit logic elements receiving as an input the output of two of said one-unit logic elements of said first row, another of said two-unit input logic elements receiving as inputs the output of another two of said one-unit logic elements of said first row; a third row of logic elements including a plurality of one-unit input logic elements and an inverter logic element, said one-unit logic elements of said third row receiving as inputs the outputs respectively of said two-unit logic elements of said second row, said inverter logic element receiving as an input the output of said one-unit logic element of said second row; a fourth row of logic elements including a plurality of one-unit input logic elements, a majority of said one-unit logic elements of said fourth row receiving as inputs the output of one of said one-unit logic elements of said fourth row, selected ones of said majority of one-unit input logic elements of said fourth providing as outputs an input to said logic elements of said second row, another of said plurality of one-unit logic elements of said fourth row receiving as an input the output of said inverter logic element of said third row, another of said plurality of one-unit logic elements of said fourth row receiving as an input the output of another of said one-unit input logic elements of said third row; an output two-unit input logic element receiving as inputs the output of selected ones of said plurality of one-unit input elements of said fourth row; a clock pulse source having three output terminals and operative to provide reset output pulses in a timed phased relationship at the separate output terminals so that reset output pulses appear at two adjoining output terminals sequentially, one of said output pulses being applied as inputs to said first and fourth rows of logic elements, a second of said output pulses being applied as inputs to said second row of logic elements and said output logic element and a third of said output pulses from said clock pulse source being applied as inputs to the logic elements of said third row, with the reset pulses blocking information from being transmitted through an element to which it is applied while the absence of a reset pulse permits information to be transmitted through a logic element.

5. A majority logic serial binary adder operative with input signals and the complementary signals thereof and comprising, a first row of logic elements including four one-unit input tunnel diode logic elements, each receiving as an input an input signal or a complementary of an input signal; a second row of logic elements including two two-unit input tunnel diode logic elements and a one-unit input tunnel diode logic element, one of said two-unit logic elements receiving as an input the output of two of said one-unit logic elements of said first row receiving said input signals as their inputs, the other of said two-unit input logic elements receiving as inputs the output of the other two of said one-unit logic elements of said first row receiving as inputs the complementary signals of said input signals and providing as an output the complementary carry signal of said input signals; a third row of logic elements including two one-unit input tunnel diode logic elements and an inverter logic element, said one-unit logic elements of said third row receiving as inputs the outputs respectively of said two-unit logic elements of said second row, said inverter logic element receiving as an input the output of said one-unit logic element of said second row; a fourth row of logic elements including five one-unit input tunnel diode logic elements, three of said one-unit logic elements of said fourth row receiving as inputs the output of one of said one-unit logic elements of said fourth row, one of said three one-unit input logic elements providing as outputs an input to each of said two-unit input logic elements of said second row, another of said three one-unit input elements of said fourth row providing as an output an input to said one-unit input logic element of said second row, a fourth of said one-unit logic elements of said fourth row receiving as an input the output of said inverter logic element of said third row to provide as an output the carry signal of said input signals, the fifth of said one-unit logic elements of said fourth row receiving as an input the output of the other of said one-unit input logic elements of said third row; an output two-unit input tunnel diode logic element receiving as inputs the output of the third of said three one-unit input elements of said fourth row, the outputs of said fourth and fifth logic elements of said fourth row and to provide the sum signal of said input signals; and a clock pulse source having three output terminals and operative to provide reset output pulses in a timed phased relationship at the separate output terminals so that reset output pulses appear at two adjoining output terminals sequentially, one of said output pulses being applied as inputs to said first and fourth rows of logic elements, a second of said output pulses being applied as inputs to said second row of logic elements and said output logic element and a third of said output pulses from said clock pulse source being applied as inputs to the logic elements of said third row, with the reset pulses blocking information from being transmitted through an element to which it is applied while the absence of a reset pulse permits information to be transmitted through a logic element.

6. A majority logic serial binary subtractor operative with input signals and the complementary signals thereof and comprising, a first row of logic elements including four one-unit input tunnel diode logic elements, each receiving as an input either one of an input signal and a complementary of an input signal; a second row of logic elements including two two-unit input tunnel diode logic elements and a one-unit tunnel diode logic element, one of said two-unit logic elements receiving as an input the output of two of said one-unit logic elements of said first row respectively receiving one of said input signals and the complimentary signals of the other of said input signals as their inputs, the other of said two-unit input logic elements receiving as inputs the output of the other two of said one-unit logic elements of said first row and providing as an output the borrow signal of said input signals; a third row of logic elements including two one-unit input tunnel diode logic elements and an inverter logic elements, said one-unit logic elements of said third row receiving as inputs the outputs respectively of said two-unit logic elements of said second row, said inverter logic element receiving as an input the output of said one-unit logic element of said second row; a fourth row of logic elements including five one-unit input tunnel diode logic elements, three of said one-unit logic elements of said fourth row receiving as inputs the output of one of said one-unit logic elements of said fourth row, one of said three one-unit input logic elements providing as outputs an input to each of said two-unit input logic elements of said second row, another of said three one-unit input elements of said fourth row providing as an output an input to said one-unit input logic element of said second row, a fourth of said one-unit input logic elements of said fourth row receiving as an input the output of said inverter logic element of said third row to provide as an output the complementary borrow signal of said input signals, the fifth of said one-unit logic elements of said fourth row receiving as an input the output of the other of said one-unit input logic elements of said third row; an output two-unit input tunnel diode logic element receiving as inputs the outputs of the third of said three one-unit input elements of said fourth row, and the outputs of said fourth and fifth logic elements of said fourth row and to provide the difference signal of said input signals; and a clock pulse source having three output terminals and operative to provide reset output pulses in a timed phased relationship at the separate output terminals so that reset output pulses appear at two adjoining output terminals sequentially, one of said output pulses being applied as inputs to said first and fourth rows of logic elements, a second of said output pulses being applied as inputs to said second row of logic elements and said output logic element and a third of said output pulses from said clock pulse source being applied as inputs to the logic elements of said third row, with the reset pulses blocking information from being transmitted through an element to which it is applied while the absence of a reset pulse permits information to be transmitted through a logic element.

No references cited.

MALCOLM A. MORRISON, *Primary Examiner.*

I. FAIBISCH, *Assistant Examiner.*